United States Patent
Lin et al.

(10) Patent No.: US 9,423,186 B2
(45) Date of Patent: Aug. 23, 2016

(54) HEAT-DISSIPATING DEVICE

(75) Inventors: Kuo-Sheng Lin, Sinjhuang (TW);
Li-Min Sun, Sinjhuang (TW);
Ching-Hsiang Cheng, Sinjhuang (TW)

(73) Assignee: Asia Vital Components Co., Ltd., Sinjhuang (TW)

( * ) Notice: Subject to any disclaimer, the term of this patent is extended or adjusted under 35 U.S.C. 154(b) by 1280 days.

(21) Appl. No.: 12/942,976

(22) Filed: Nov. 9, 2010

(65) Prior Publication Data

US 2011/0277966 A1    Nov. 17, 2011

(30) Foreign Application Priority Data

May 14, 2010    (TW) .................................. 99115436

(51) Int. Cl.
| F28F 7/00 | (2006.01) |
| H01L 23/427 | (2006.01) |
| F28D 15/02 | (2006.01) |
| H01L 23/467 | (2006.01) |
| H01L 23/367 | (2006.01) |

(52) U.S. Cl.
CPC ......... *F28D 15/0275* (2013.01); *H01L 23/427* (2013.01); *H01L 23/467* (2013.01); *H01L 23/3672* (2013.01); *H01L 2924/0002* (2013.01)

(58) Field of Classification Search
CPC ............. F28D 15/0275; H01L 23/427; H01L 23/467; H01L 23/3672
USPC ....... 165/104.26, 104.33, 104.21, 80.2, 80.3; 361/700, 703
See application file for complete search history.

(56) References Cited

U.S. PATENT DOCUMENTS

| 2002/0020523 A1* | 2/2002 | Sheu ............................. 165/185 |
| 2005/0103476 A1* | 5/2005 | Chen et al. ............... 165/104.33 |
| 2006/0070721 A1* | 4/2006 | Chen ............................ 165/80.3 |
| 2008/0078528 A1* | 4/2008 | Lai et al. ................. 165/104.21 |

FOREIGN PATENT DOCUMENTS

| CN | 1967440 A | 5/2007 |
| CN | 200959706 Y | 10/2007 |
| CN | 101099986 A | 1/2008 |
| CN | 101316495 A | 12/2008 |
| CN | 201259390 Y | 6/2009 |
| CN | 101528019 A | 9/2009 |
| TW | I308051 B | 3/2009 |
| TW | I308685 B | 4/2009 |
| TW | M354318 U | 4/2009 |
| TW | M356369 U | 5/2009 |
| TW | I317413 B | 11/2009 |

(Continued)

*Primary Examiner* — Marc Norman
*Assistant Examiner* — Jon T Schermerhorn
(74) *Attorney, Agent, or Firm* — C. G. Mersereau; Nikolai & Mersereau, P.A.

(57) ABSTRACT

The present invention provides a heat-dissipating device including a heat sink and a heat pipe. The heat sink has an end surface provided with a trough. The trough has an open side and a closed side. The heat pipe has a heat-absorbing surface and a heat-conducting surface corresponding to the open side and the closed side respectively. The heat-conducting surface and the heat-absorbing surface are not brought into contact with the heat sink. The heat is directly absorbed by the heat pipe and then conducted to the heat sink for dissipation. With this arrangement, heat resistance of the heat-dissipating device is reduced to improve the heat-dissipating effect thereof.

3 Claims, 8 Drawing Sheets

(56) References Cited  * cited by examiner

FOREIGN PATENT DOCUMENTS

| TW | M372072 U | 1/2010 |
| TW | I373601 A | 2/2010 |
| TW | M392946 U | 11/2010 | ize, low boiling point and stable chemical properties,
HEAT-DISSIPATING DEVICE This application claims the priority benefit of Taiwan patent application number 099115436 filed on May 14, 2010.

BACKGROUND OF THE INVENTION

1. Field of the Invention

The present invention relates to a heat-dissipating device, and in particular to a heat-dissipating device, whereby manufacturing cost is saved and heat resistance is reduced.

2. Description of Prior Art

Currently, heat pipe is a heat-conducting element widely used in electronic apparatuses and electronic elements. In general, the interior of the heat pipe is filled with a heat-conducting medium of good flowability, high heat of vaporization, low boiling point and stable chemical properties, such as water, ethanol, acetone or the like. The inner surfaces of the heat pipe are usually formed with a wick structure having a lot of protrusions.

In operation, one of the heat pipe acts as an evaporating section connected to a base of an electronic element, and the other end of the heat pipe acts as a condensing section assembled with a plurality of heat-dissipating fins. With this arrangement, when the evaporating section of the heat pipe is heated, the heat-conducting medium located in the evaporating section is vaporized to absorb a lot of latent heat of evaporation. As a result, the temperature of the base can be lowered. Then, the vapor-phase heat-conducting medium diffuses to the condensing section. The vapor-phase heat-conducting medium condenses into its liquid phase to release a lot of latent heat of condensation and flows back to the evaporating section through the wick structure. The heat-dissipating fins assembled with the condensing section dissipate the latent heat of condensation to the outside.

Please refer to FIG. 1, which is an exploded perspective view showing a conventional heat-dissipating device. The heat-dissipating device 3 is constituted of a heat sink 31 having fins, a base 32 and at least one heat pipe 33. The heat sink 31 has a heat-absorbing portion 311 and a heat-dissipating portion 312. The heat-absorbing portion 311 is adhered to the base 32. One end of the heat pipe 33 is disposed between the heat-absorbing portion 311 and the base 32. The other end of the heat pipe 33 is disposed through the heat-dissipating portion 312. The heat-dissipating device 3 is brought into thermal contact with the base 32 to absorb the heat generated by a heat source 4. The heat is conducted from the base 32 to the heat sink 31 and the heat pipe 33, and then the heat is conducted from the heat pipe 33 to the heat-dissipating portion 312 of the heat sink 31. By this structure, the heat-dissipating efficiency of the whole heat-dissipating device can be improved.

The base 32 of the conventional heat-dissipating device 3 has the following functions. The base 32 is combined with the heat sink 31 to directly conduct the heat to the heat-dissipating portion 312 of the heat sink 31. Further, one side of the base 32 is provided with at least one groove 321 for allowing the heat pipe 33 to be received in and combined with the heat sink 31 because the heat pipe 33 is formed into a cylindrical pipe and unable to contact the heat source 4 properly. With the base 32 being brought into thermal contact with the heat source 4 to absorb the heat generated by the heat source 4, the heat can be conduct from the base 32 to the heat sink 31 and the heat pipe 33.

Since a gap is inevitably formed between two connected heat-dissipating elements, heat resistance is generated between these two heat-dissipating elements. In order to reduce the heat resistance, these two heat-dissipating elements can be soldered together by electrical-conductive solder. However, when a plurality of heat-dissipating elements is assembled together, the heat-dissipating efficiency of the whole structure is insufficient. On the other hand, it takes more time to assemble the plurality of heat-dissipating elements together, which undesirably raises the manufacturing cost.

Further, the combination of the base and the heat sink makes the whole heat-dissipating device bulky and unable to be moved easily. Also, such a large-sized heat-dissipating device occupies more space, so that the application thereof is limited.

According to the above, the conventional heat-dissipating device has drawbacks as follows: (1) higher cost; (2) more working hours for assembly; (3) unable to be used in a smaller space; and (4) low in heat-conducting and heat-dissipating efficiency.

SUMMARY OF THE INVENTION

A primary objective of the present invention is to provide a heat-dissipating device, whereby the heat resistance thereof is reduced.

Another objective of the present invention is to provide a heat-dissipating device, whereby the manufacturing cost thereof is reduced.

A further objective of the present invention is to provide a heat-dissipating device, which can be assembled easily.

In order to achieve the above objectives, the present invention is to provide a heat-dissipating device including a heat sink and at least one heat pipe. The heat sink is made by superposing a plurality of heat-dissipating fins and has a heat-dissipating portion and a heat-absorbing portion. The heat-absorbing portion has an end surface. The end surface is provided with a trough. One side surface of the heat-absorbing portion is provided with at least one through-hole in communication with both sides of the trough. The heat pipe has a heat-absorbing end and a heat-dissipating end. The heat-absorbing end has a heat-absorbing surface and a heat-conducting surface. The heat-absorbing surface is adjacent to the heat-conducting surface. The heat-absorbing end of the heat pipe is inserted into the through-hole. The heat-conducting surface is positioned in the trough in such a manner that the heat-conducting surface is not brought into contact with the heat sink. The heat-dissipating end is disposed through the heat-dissipating portion.

By this structure, the heat pipe absorbs the heat generated by a heat-generating element and conducts the heat to the heat-dissipating fins. Thus, the heat resistance and the manufacturing cost are reduced while an excellent heat-dissipating effect is achieved. Further, the heat sink can be made with reduced amount of materials, thereby making the heat sink to have a smaller weight and reducing the material cost.

According to the above, the present invention has advantages as follows: (1) reduced manufacturing cost; (2) smaller weight; (3) smaller heat resistance; and (4) less working hours and rapid assembly.

DETAILED DESCRIPTION OF THE INVENTION

Figure 1:
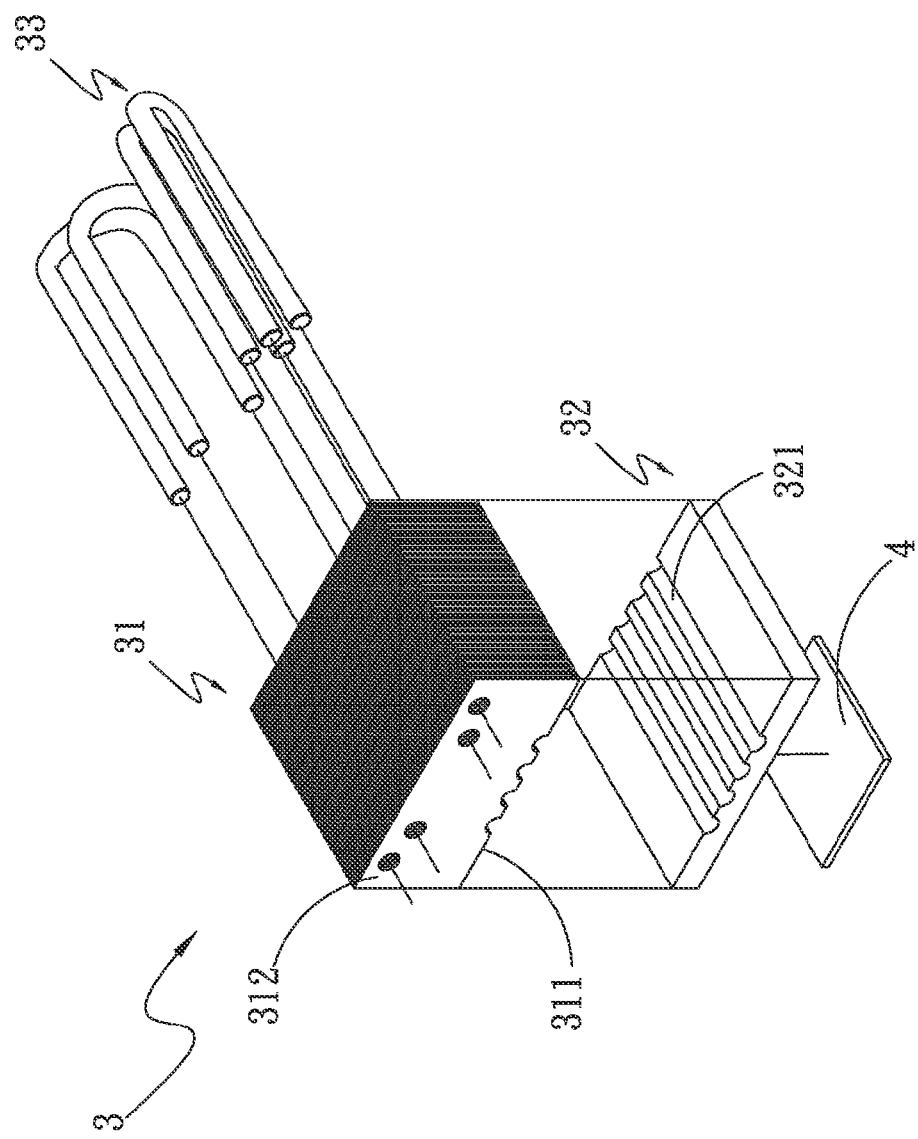
FIG. 1 is an exploded perspective view showing a conventional heat-dissipating device.
Figure 2:
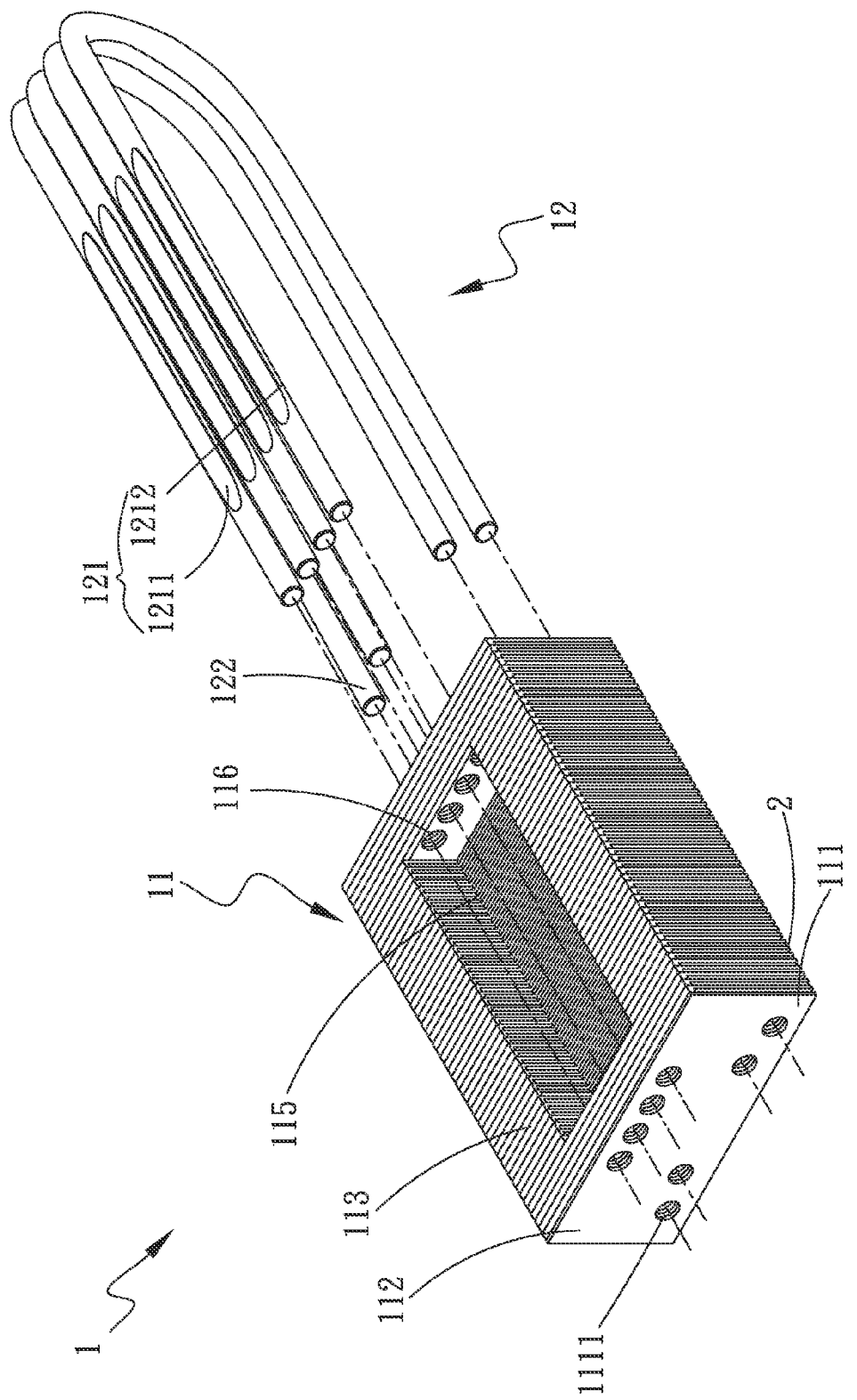
FIG. 2 is an exploded perspective view showing a heat-dissipating device according to a first embodiment of the present invention.
Figure 3:
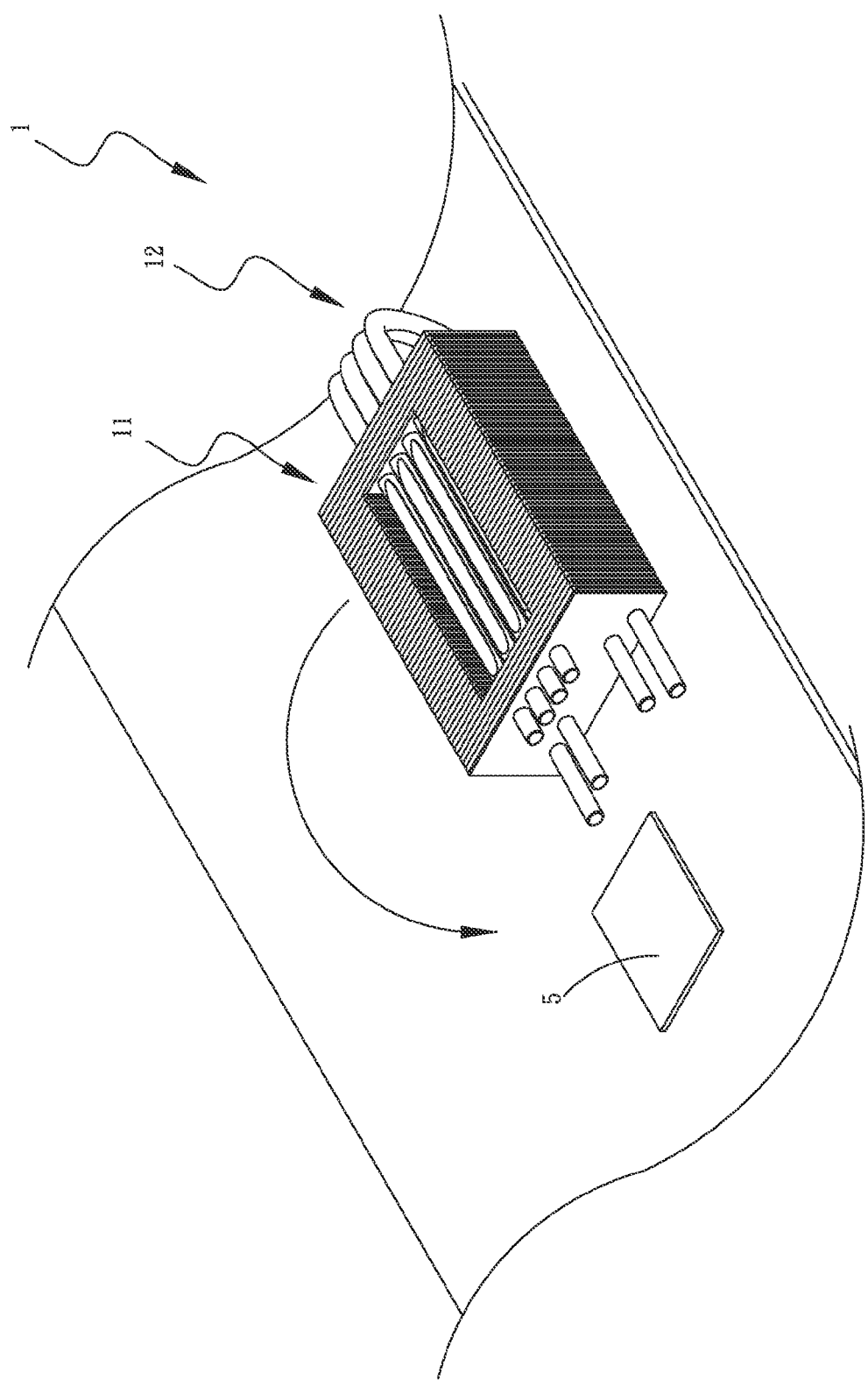
FIG. 3 is an assembled perspective view showing the heat-dissipating device according to the first embodiment of the present invention.

The above objectives and structural and functional features of the present invention will be described in more detail with reference to preferred embodiment thereof shown in the accompanying drawings FIG. 2 is an exploded perspective view showing a heat-dissipating device according to a first embodiment of the present invention, and FIG. 3 is an assembled perspective view showing the heat-dissipating device according to the first embodiment of the present invention. As shown in these figures, the heat-dissipating device 1 includes a heat sink 11 and at least one heat pipe 12.

The heat sink 11 is constituted by superposing a plurality of heat-dissipating fins 2. The heat sink 11 has a heat-dissipating portion 111 and a heat-absorbing portion 112. The heat-absorbing portion 111 has an end surface 113. The end surface 113 is provided with a trough 115. One side surface of the heat-absorbing portion 112 is provided with at least one through-hole 116 in communication with both sides of the trough 115. The heat-dissipating portion 111 is connected to the heat-absorbing portion 112. The heat-dissipating portion 111 is formed by extending from one side of the heat-absorbing portion 112 away from the heat-absorbing portion 112. The heat-dissipating portion 111 is provided with at least one hole 1111.

The heat pipe 12 has a heat-absorbing end 121 and a heat-dissipating end 122. The heat-absorbing end 121 has a heat-absorbing surface 1211 and a heat-conducting surface 1212. The heat-absorbing surface 1211 is adjacent to the heat-conducting surface 1212. The heat-absorbing end 121 of the heat pipe 12 is inserted into the through-hole 116 in such a manner that the heat-conducting surface 1212 is positioned to face outwardly of the trough 115 and not brought into contact with the heat sink 11. The heat-dissipating end 122 is disposed through the heat-dissipating portion 111.

The heat-dissipating device is brought into contact with at least one heat-generating element 5 to conduct the heat generated by the heat-generating element 5. The heat-conducting surface 1211 of the heat pipe 12 is brought into thermal contact with the heat-generating element 5 directly.

Figure 4:
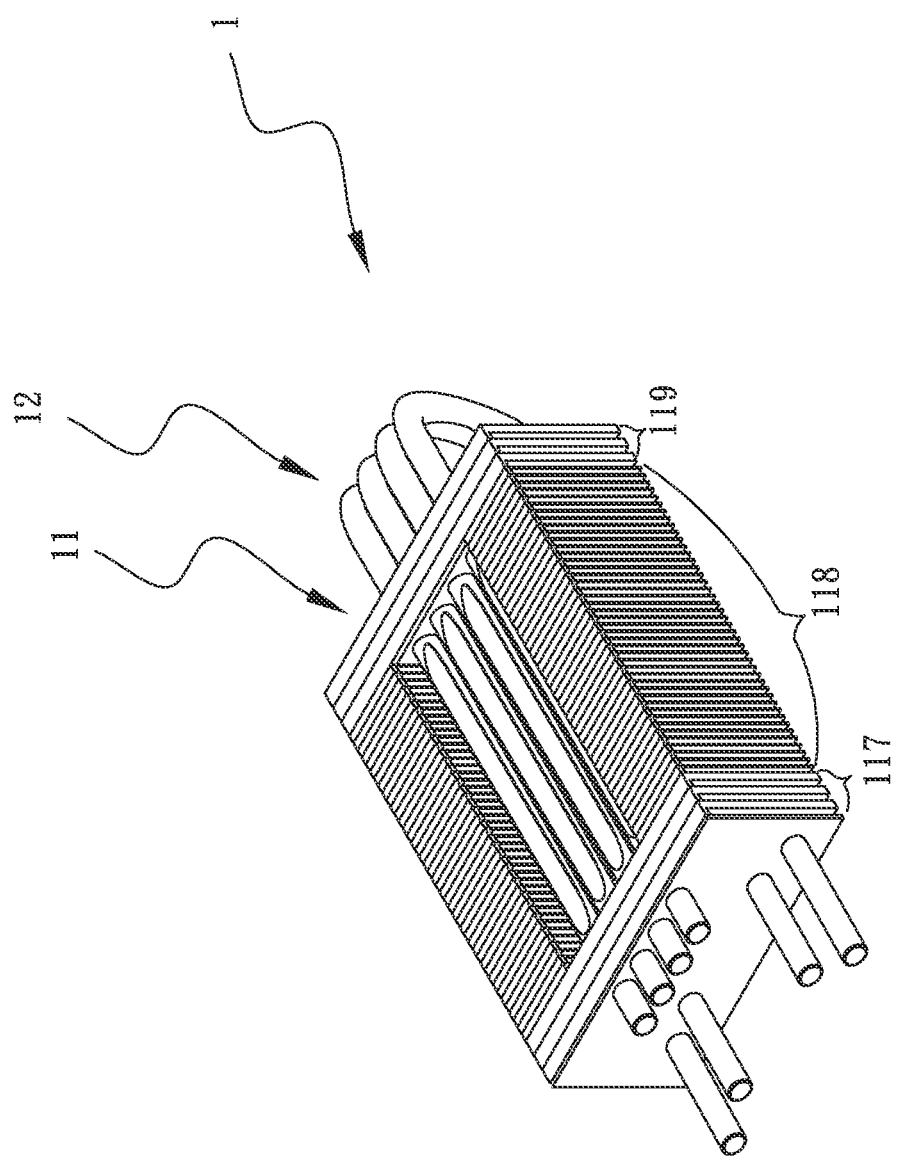
FIG. 4 is an assembled perspective view showing the heat-dissipating device according to a second embodiment of the present invention.

Please refer to FIG. 4, which is an assembled perspective view showing the heat-dissipating device according to the second embodiment of the present invention. As shown in this figure, the structural relationship among respective components of the second embodiment is substantially the same as that of the first embodiment, so that the redundant description is omitted for simplicity. The difference between the second embodiment and the first embodiment is pointed out as follows. The heat sink 11 further has a first portion 117, a second portion 118, and a third portion 119. The first portion 117 and the third portion 119 are provided on both ends of the second portion 118. Of course, the relative position among these three portions may be changed based on practical demands. The thickness of the heat-dissipating fin 2 located in the first portion 117 and the third portion 119 is larger than that of the heat-dissipating fin 2 located in the second portion 118. Alternatively, the heat-dissipating fin may be made of a material of a larger structural strength to thereby increase the strength of the whole heat-dissipating device 1.

Figure 5:
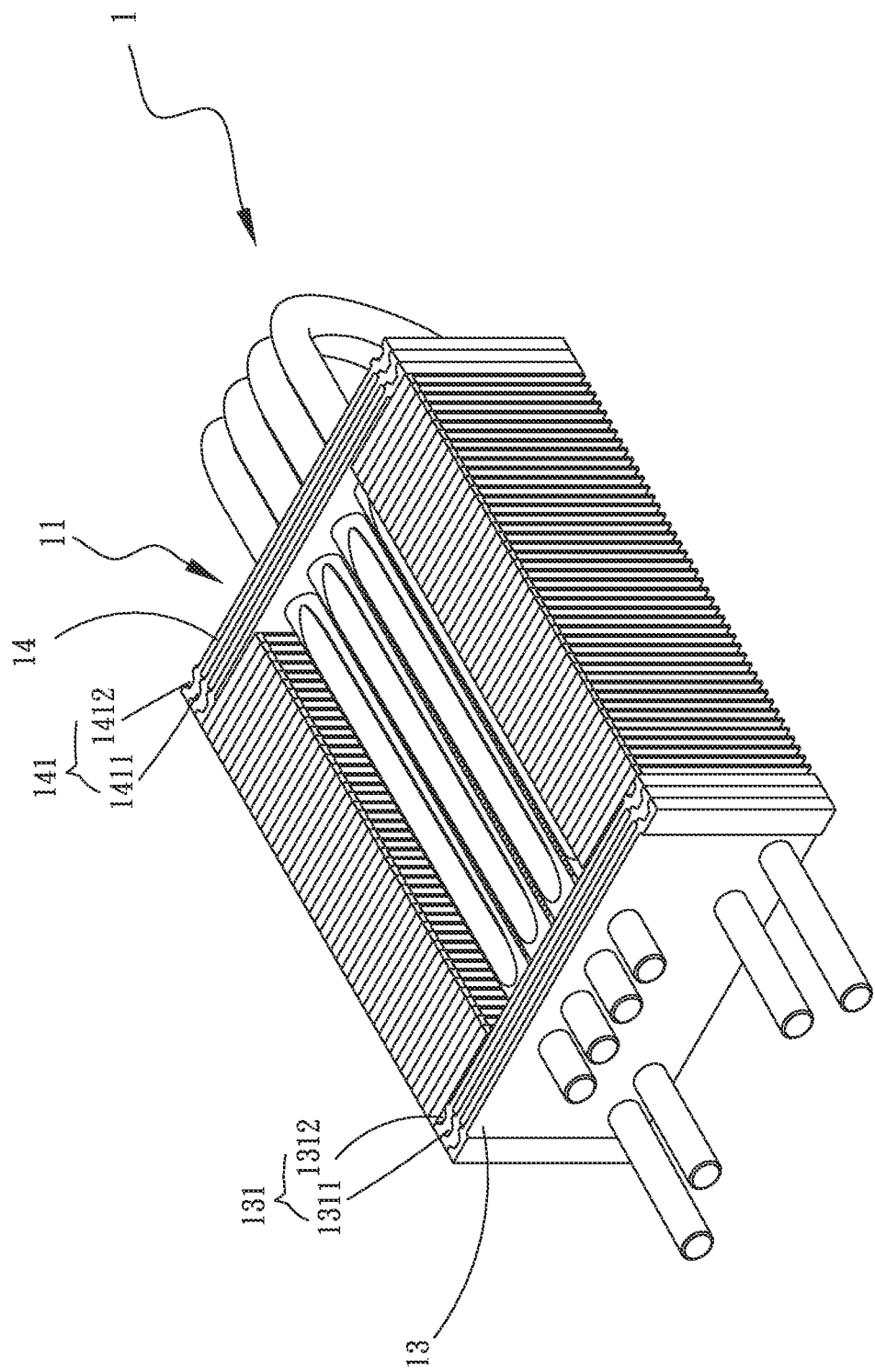
FIG. 5 is an assembled perspective view showing the heat-dissipating device according to a third embodiment of the present invention.
Figure 6:
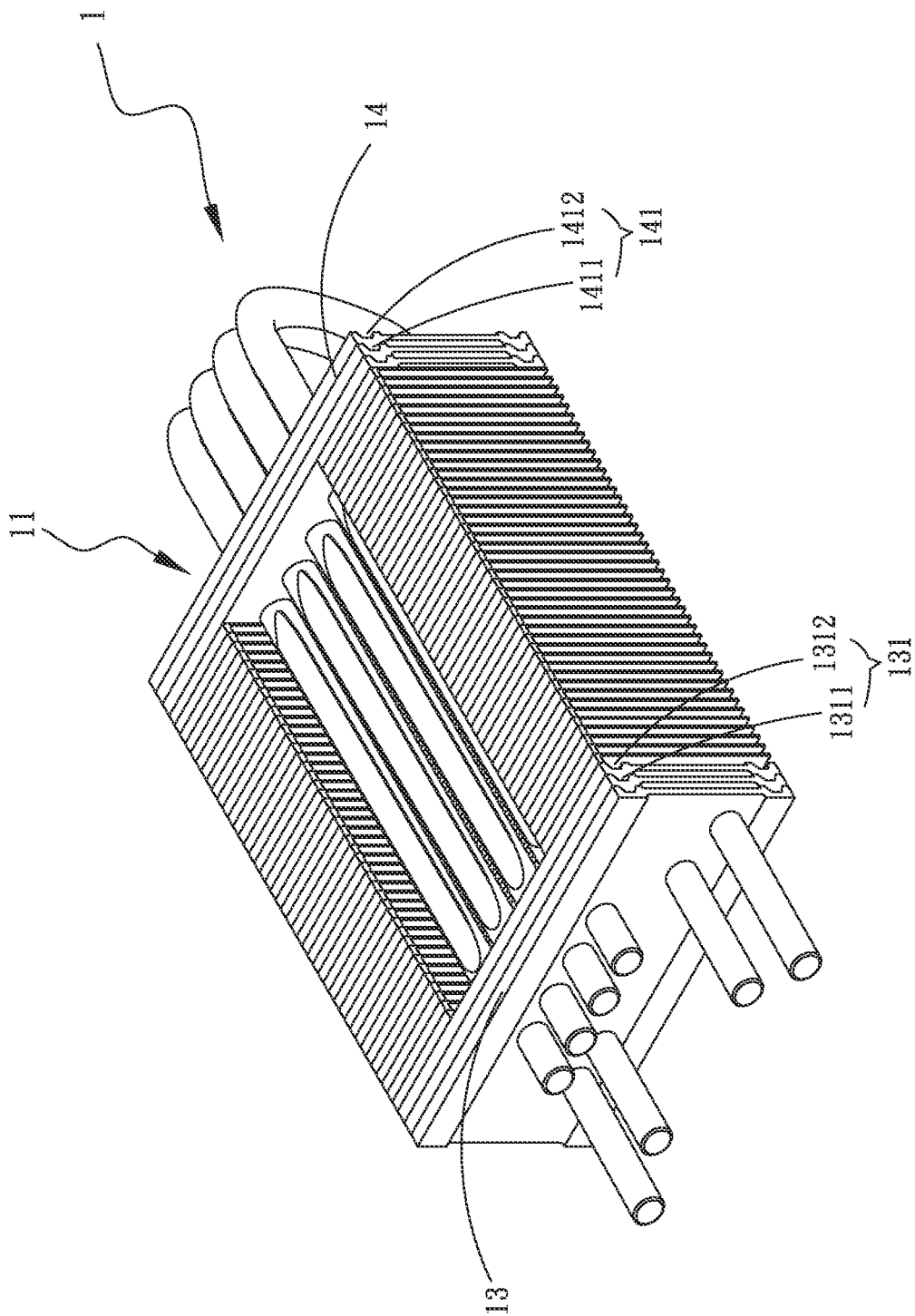
FIG. 6 is an assembled perspective view showing the heat-dissipating device according to a fourth embodiment of the present invention.

Please refer to FIGS. 5 and 6, which are assembled perspective views showing the heat-dissipating device according to the third and fourth embodiments of the present invention respectively. As shown in this figure, the structural relationship among respective components of the third and fourth embodiments is substantially the same as that of the first embodiment, so that the redundant description is omitted for simplicity. The difference between the third and fourth embodiments and the first embodiment is pointed out as follows. The heat-dissipating device 11 has a first reinforcement portion 13 and a second reinforcement portion 14. The first reinforcement portion 13 and the second reinforcement portion 14 are provided on both ends of the heat sink 11 for increasing the structural strength of the heat sink 11. Further, the difference between the third embodiment and the fourth embodiment lies in that the first reinforcement portion 13 and the second reinforcement portion 14 of the third embodiment (as shown in FIG. 5) are configured to reinforce the short sides of the heat sink 1, while the first reinforcement portion 13 and the second reinforcement portion 14 of the fourth embodiment (as shown in FIG. 6) are configured to reinforce the long sides of the heat sink 1. Thus, the relative angle shift between the reinforcement portions 13 and 14 of the third embodiment and those of the fourth embodiment is 90 degrees.

Figure 7:
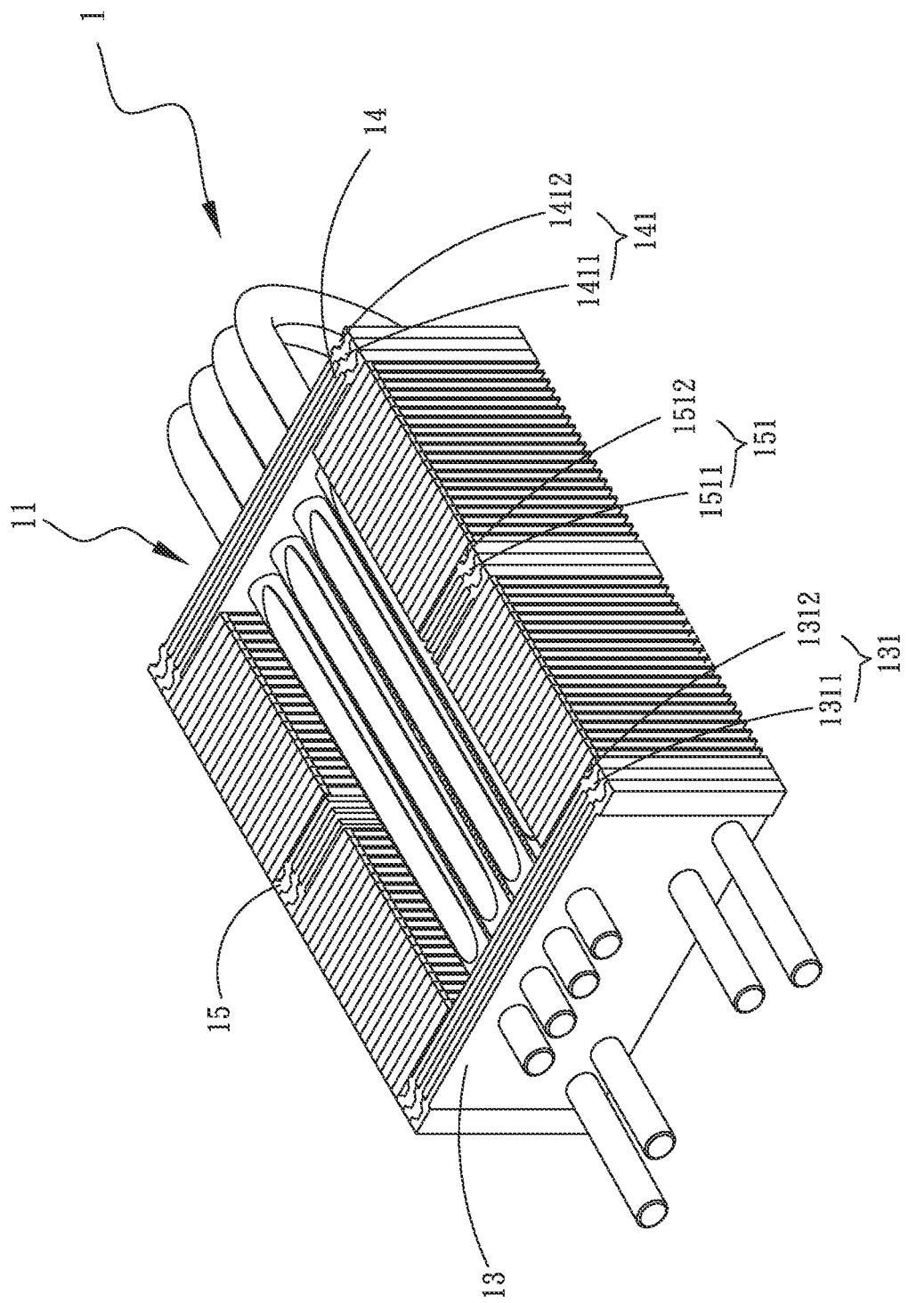
FIG. 7 is an assembled perspective view showing the heat-dissipating device according to a fifth embodiment of the present invention.
Figure 8:
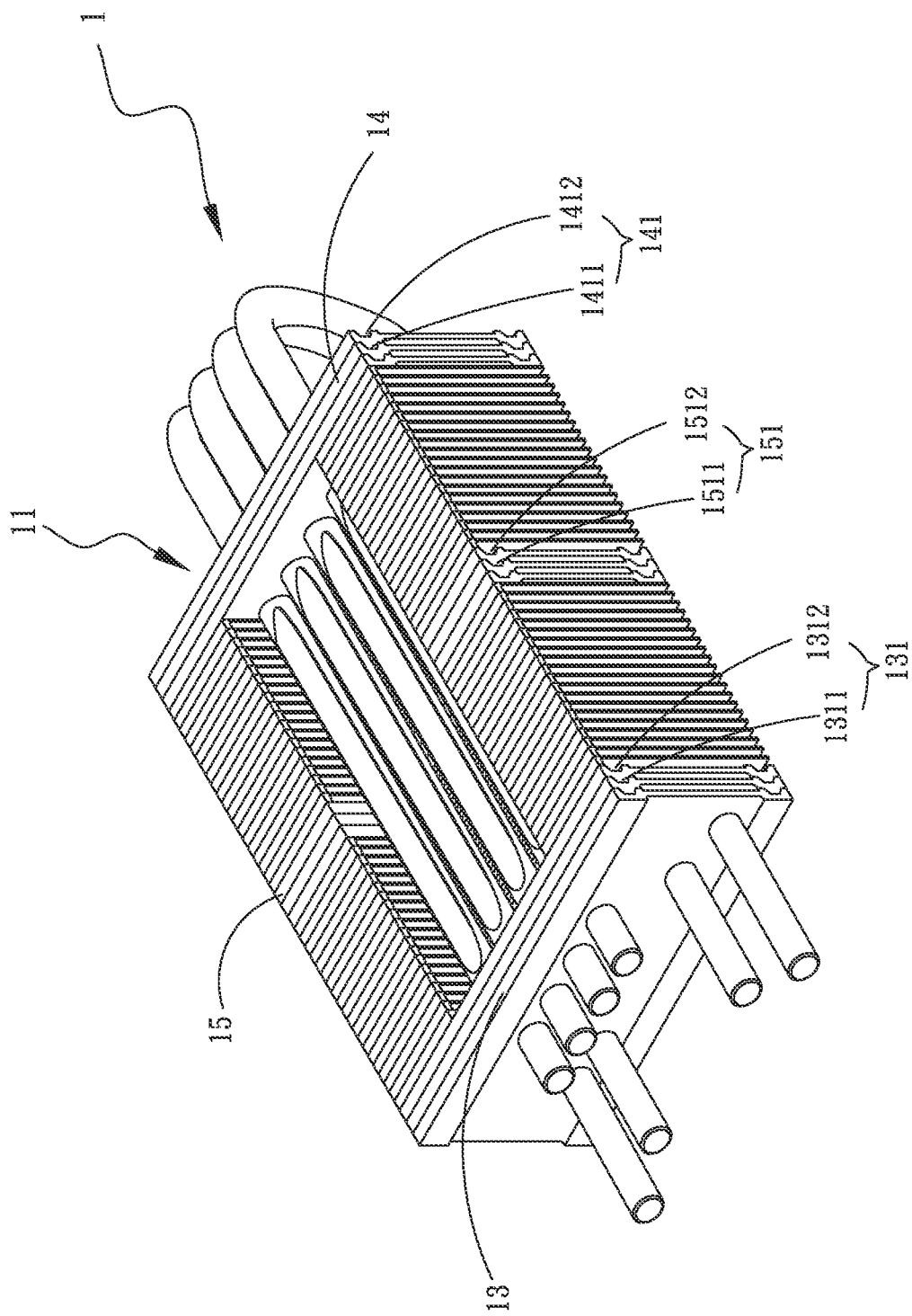
FIG. 8 is an assembled perspective view showing the heat-dissipating device according to a sixth embodiment of the present invention.

Please refer to FIGS. 7 and 8, which are assembled perspective views showing the heat-dissipating device according to the fifth and sixth embodiments of the present invention respectively. As shown in this figure, the structural relationship among respective components of the fifth and sixth embodiments is substantially the same as that of the first embodiment, so that the redundant description is omitted for simplicity. The difference between the fifth and sixth embodiments and the first embodiment is pointed out as follows. The heat-dissipating device 11 has at least one first reinforcement portion 13, at least one second reinforcement portion 14 and at least one third reinforcement portion 15. The first reinforcement portion 13 and the second reinforcement portion 14 are provided on both sides of the third reinforcement portion 15. The heat-dissipating fins 2 are provided between the third reinforcement portion 15 and the first reinforcement portion 13 as well as between the third reinforcement portion 15 and the second reinforcement portion 14. The first, second and third reinforcement portions 13, 14 and 15 are configured to increase the structural strength of the heat sink 11. Further, the difference between the fifth embodiment and the sixth embodiment lies in that the first reinforcement portion 13, the second reinforcement portion 14 and the third reinforcement portion 15 of the fifth embodiment (as shown in FIG. 7) are configured to reinforce the short sides of the heat sink 1, while the first reinforcement portion 13, the second reinforcement portion 14 and the third reinforcement portion 15 of the sixth embodiment (as shown in FIG. 8) are configured to reinforce the long sides of the heat sink 1. Thus, the relative angle shift between the reinforcement portions 13, 14 and 15 of the fifth embodiment and those of the sixth embodiment is 90 degrees.

Please refer to FIGS. 5, 6, 7, 8 again. As shown in these figures, the first reinforcement portion 13 has a first connecting portion 131. The first connecting portion 131 has a first connecting end 1311 and a first connecting groove 1312. The second reinforcement portion 14 has a second connecting portion 141. The second connecting portion 141 has a second connecting end 1411 and a second connecting groove 1412. The third reinforcement portion 15 has a third connecting portion 151. The third connecting portion 151 has a third connecting end 1511 and a third connecting groove 1512. The first connecting end 1311 of the first reinforcement portion 13, the second connecting end 1411 of the second reinforcement portion 14, and the third connecting end 1511 of the third reinforcement portion 15 are inserted into the first connecting groove 1312 of the first reinforcement portion 13, the second connecting groove 1412 of the second reinforcement portion 14, and the third connecting groove 1512 of the third reinforcement portion 15 respectively. In this way, the first reinforcement portion 13, the second reinforcement portion 14, and the third reinforcement portion 15 can be assembled together.

Further, it is apparent that the heat-dissipating device of the present invention may be made of the aforesaid reinforcement portions completely. The reinforcement portion (any of the first reinforcement portion 13, the second reinforcement portion 14, and the third reinforcement portion 15) is made of heat-conductive materials such as metal or non-metal.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A heat-dissipating device, including:
a heat sink made by superposing a plurality of heat-dissipating fins, the heat sink having a heat-dissipating portion and a heat-absorbing portion, the heat-absorbing portion having an end surface, the end surface being provided with a trough, one side surface of the heat-absorbing portion being provided with at least one through-hole in communication with both sides of the trough;
at least one heat pipe having a heat-absorbing end and a heat-dissipating end, the heat-absorbing end having a heat-absorbing surface and a heat-conducting surface, the heat-absorbing surface being adjacent to the heat-conducting surface, the heat-absorbing end of the heat pipe being inserted into the through-hole, the heat-conducting surface and the heat-absorbing surface being positioned in the trough in such a manner that both of them are not brought into contact with the heat sink, the heat-dissipating end being disposed through the heat-dissipating portion; and
at least one heat-generating element being in brought into thermal contact with the heat-conducting surface of the heat pipe directly;
wherein the heat sink further has a first portion, a second portion and a third portion, the first portion and the third portion are provided on both ends of the second portion, the thickness of the entire heat-dissipating fin located in the first portion and the third portion is larger than the thickness of the entire heat-dissipating fin located in the second portion;
wherein the fins of the heat sink further have short sides and long sides and the heat sink has at least one first reinforcement portion and at least one second reinforcement portion, the at least one first reinforcement portion and the at least one second reinforcement portion are provided on opposite ends of the heat sink and each first reinforcement portion and each second reinforcement portion is configured to reinforce the short sides or the long sides of the heat sink according to the orientation of the reinforcement portion, the reinforcement portions being correspondingly parallel to either the short sides or the long sides of the fins of the heat sink;
wherein the heat sink further has at least one third reinforcement portion, the at least one first reinforcement portion and the at least one second reinforcement portion are provided on both sides of the at least one third reinforcement portion, the heat-dissipating fins are provided between the at least one third reinforcement portion and the at least one first reinforcement portion as well as between the at least one third reinforcement portion and the at least one second reinforcement portion;
wherein each first reinforcement portion has a first connecting portion, the first connecting portion has a first connecting end and a first connecting groove, the first connecting end being engaged with the first connecting groove, each second reinforcement portion has a second connecting portion, the second connecting portion has a second connecting end and a second connecting groove, the second connecting end being engaged with the second connecting groove, each third reinforcement portion has a third connecting portion, the third connecting portion has a third connecting end and a third connecting groove, the third connecting end being engaged with the third connecting groove, wherein each reinforcement portion has two connecting portions, one on each side, and the connecting portions extend the entire length of the side they are on.

2. The heat-dissipating device of claim 1, wherein the reinforcement portions are configured to reinforce the short sides of the heat sink.

3. The heat-dissipating device of claim 1, wherein the reinforcement portions are configured to reinforce the long sides of the heat sink.

* * * * *